(12) United States Patent
Lee et al.

(10) Patent No.: US 8,703,368 B2
(45) Date of Patent: Apr. 22, 2014

(54) LITHOGRAPHY PROCESS

(75) Inventors: Yung-Yao Lee, Zhubei (TW); Ying Ying Wang, Xin-Zhu (TW); Heng-Hsin Liu, New Taipei (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/550,036

(22) Filed: Jul. 16, 2012

(65) Prior Publication Data

US 2014/0017604 A1 Jan. 16, 2014

(51) Int. Cl.
 *G03F 9/00* (2006.01)
(52) U.S. Cl.
 USPC .................. 430/22; 430/30; 430/302
(58) Field of Classification Search
 USPC ............................................. 430/22, 30, 302
 See application file for complete search history.

(56) References Cited

U.S. PATENT DOCUMENTS

| 6,870,599 B2 * | 3/2005 | Kurosawa ........................ 355/53 |
| 2008/0013089 A1 * | 1/2008 | Ishii et al. ..................... 356/400 |
| 2012/0026478 A1 * | 2/2012 | Chen et al. ....................... 355/53 |

* cited by examiner

*Primary Examiner* — Christopher Young
(74) *Attorney, Agent, or Firm* — Haynes and Boone, LLP

(57) ABSTRACT

A process for use in lithography, such as photolithography for patterning a semiconductor wafer, is disclosed. The process includes receiving an incoming semiconductor wafer having various features and layers formed thereon. A unit-induced overlay (uniiOVL) correction is received and a deformation measurement is performed on the incoming semiconductor wafer in an overlay module. A deformation-induced overlay (defiOVL) correction is generated from the deformation measurement results by employing a predetermined algorithm on the deformation measurement results. The defiOVL and uni-iOVL corrections are fed-forward to an exposure module and an exposure process is performed on the incoming semiconductor wafer.

20 Claims, 5 Drawing Sheets

LITHOGRAPHY PROCESS

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

Semiconductor devices are fabricated by creating a sequence of patterned and un-patterned layers where the features on patterned layers are spatially related to one another. Thus during fabrication, each patterned layer aligns to a previous patterned layer, and as such, an overlay between a first layer and a second layer is taken into account. The overlay is the relative position between two or more layers of a semiconductor substrate such as, for example, a wafer. As semiconductor processes evolve to provide for smaller critical dimensions, and devices reduce in size and increase in complexity including number of layers, the alignment precision between layers becomes increasingly more important to the quality, reliability, and yield of the devices. The alignment precision is usually measured as overlay offset or overlay error, or the distance and direction which a layer is offset from precise alignment with a previous layer. Misalignments can result in reduced device performance or complete device failure. Conventional overlay metrology is used to check alignment but has not been satisfactory in all regards. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
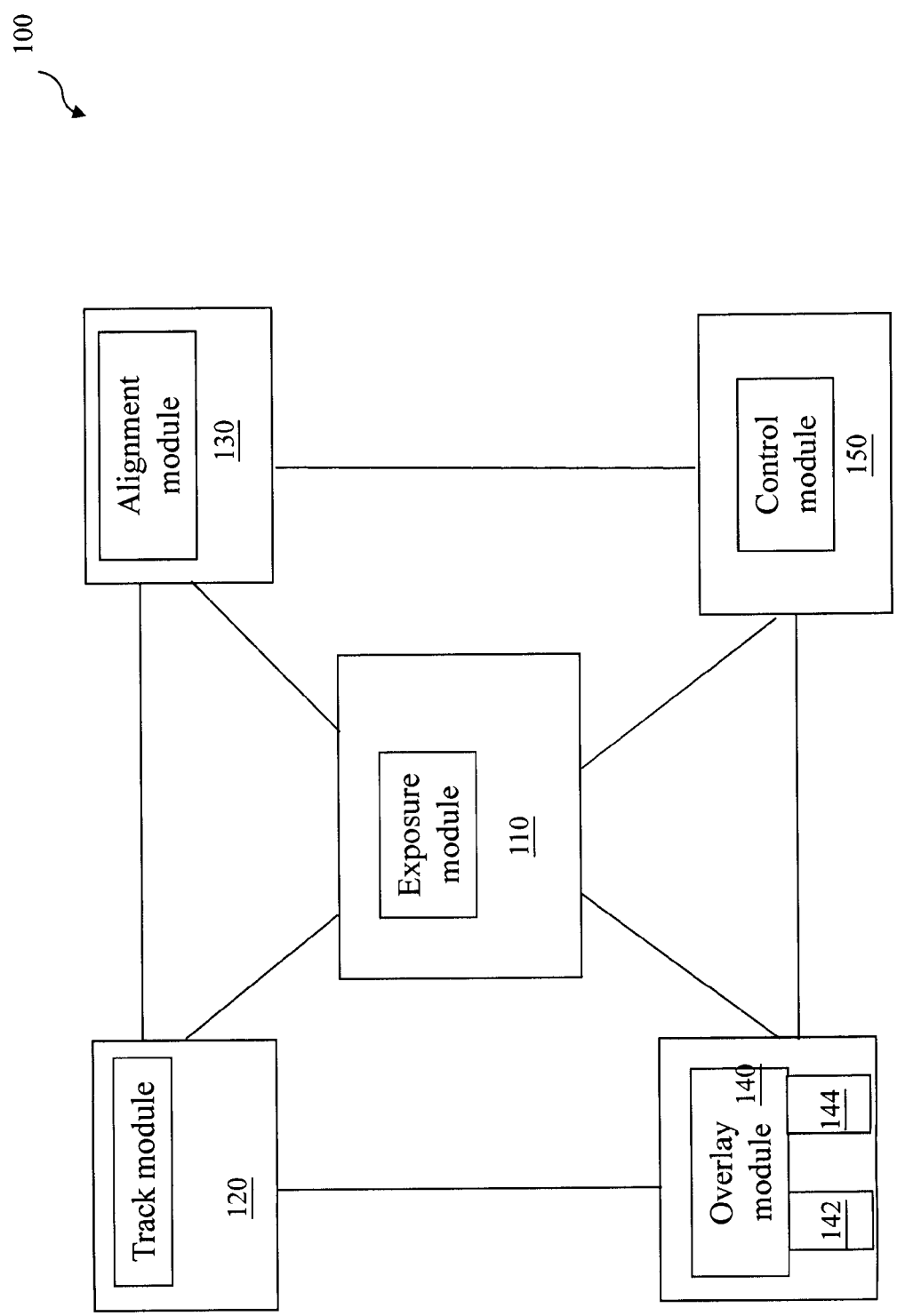
FIG. 1 is a simplified block diagram of a lithography system for implementing one or more embodiments of the present invention.

FIG. 1 is simplified block diagram of a lithography system 100 for performing various lithography patterning processes. The lithography system 100 includes various processing tools and metrology tools coupled together and configured for performing various lithography processes including coating, aligning, exposuring, baking, developing and/or other lithography patterning processes. Therefore, these coupled processing tools and metrology tools are collectively referred to as the lithography system 100. However, each tool of the lithography system 100 may be reconfigured, such as being reconfigured to be coupled with other lithography tools or be a part of another lithography system.

Figure 2:
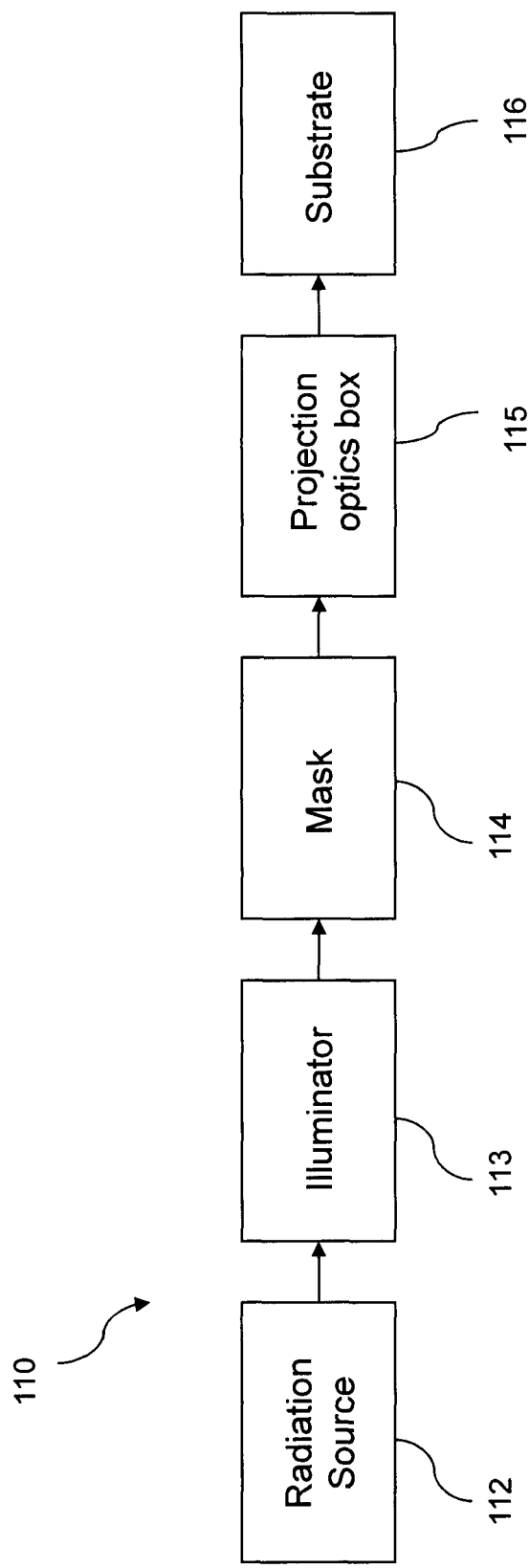
FIG. 2 is a simplified block diagram of an embodiment of an exposure module of the lithography system in FIG. 1.

The lithography system 100 includes an exposure module 110 designed to perform a lithography exposure process to a radiation-sensitive material layer (e.g., photoresist layer or resist layer) on a substrate. Referring to FIG. 2, the exposure module 110 includes a radiation source 112, an illumination system 113, a mask 114 (in the present disclosure, the terms of mask, photomask, and reticle are used to refer to the same item), a plurality of projection optics 115 and a substrate 116 such as a semiconductor wafer on a substrate stage. However, other configurations and inclusion or omission of devices may be possible.

The radiation source 112 may include a light source selected from the group consisting of ultraviolet (UV) source, deep UV (DUV) source, extreme UV (EUV) source, and X-ray source. For example, the radiation source 110 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride (F2) excimer laser with a wavelength of 157 nm; or other light sources having a desired wavelength (e.g., below approximately 100 nm). In another example, the light source is an EUV source having a wavelength of about 13.5 nm or less.

The illumination system 113 may include refractive optics, such as a single lens or a lens system having multiple lenses, and reflective optics such as mirrors. For example, the illumination system 113 includes micro-lens arrays, shadow masks, and/or other structures designed to aid in directing light from the light source 112 towards the mask 114.

The mask 114 can be a transparent mask or a reflective mask. A transparent mask includes a transparent substrate and a patterned absorption (opaque) layer. A light beam may be partially or completely blocked when directed on an opaque region. The opaque layer may be patterned to have one or more openings through which a light beam may travel through (for a transparent mask) or reflect from a reflective region (for a reflective mask). The mask 114 may incorporate other resolution enhancement techniques such as phase shift mask (PSM) and/or optical proximity correction (OPC).

The projection optics 115 may have refractive optics or reflective optics. The projection optics 115 direct the patterned radiation towards the substrate 116 (e.g., a semiconductor wafer). The substrate 116 includes a photosensitive layer (e.g., photoresist or resist), which is sensitive to the radiation. The substrate 116 may be held by a target substrate stage. The target substrate stage provides control of the target substrate position such that the image of the reticle is scanned onto the target substrate in a repetitive fashion (though other lithography methods are possible).

Referring again to FIG. 1, the lithography system 100 also includes a track module 120 coupled with the exposure module 110. The track module 120 performs resist processing on an incoming substrate. The resist processing includes coating, baking and development according to one embodiment. In another embodiment, the resist processing includes coating, soft-baking, hard-baking and development. The track module 120 is coupled with the exposure module 110 such that the substrate (e.g. a semiconductor wafer) can be exchanged between them.

The lithography system 100 also includes an alignment module 130 configured to be coupled with the exposure module 110. The alignment module 130 is coupled with the exposure module 110 for aligning an incoming substrate. The alignment module 130 may be stand-alone or embedded in the exposure module 110. In one embodiment, the alignment process includes measuring the alignment marks relative to a reference structure in the substrate, such as a virtual grid, to define the alignment error. In one embodiment, the measured alignment error is used for a proper tuning process to reduce alignment error and overlay error The lithography system 100 also includes an overlay module 140 designed to provide overlay corrections to the exposure module 110. The overlay module 140 includes an overlay measurement tool 142 to perform an overlay measurement after the resist layer on the substrate is patterned. For example, overlay errors are measured between the patterned resist layer and the underlying material layer on the substrate. In the present embodiment, the overlay module 140 also includes a deformation measurement tool 144 to measure deformation of an incoming substrate. By using overlay measurements and deformation measurements, overlay error corrections are generated in the overlay module 140 and sent to the exposure module 110. According to the overlay error corrections, exposure process parameter adjustments may be employed for exposing the incoming substrate.

The lithography system 100 also includes a control module 150 designed for controlling the exposure module 110 or for controlling other portions of the lithography system 100 to tune various parameters in order to eliminate or reduce the overlay error. The control module 150 includes a processor, memory, and interface for storing and executing software and performing one or more tuning processes. In one embodiment, the control module 150 may utilize the alignment data from the alignment measurement to perform a tuning process. In one embodiment, the tuning process includes tuning a tilt angle of the substrate (or reticle) and/or the imaging unit of the exposure module 110 to reduce the overlay error. In another embodiment, the tuning process includes shifting (transitional and/or rotational) the substrate during the exposure process. In yet another embodiment, the tuning process includes dynamically tuning the exposure dose or imaging lens. In various embodiments, the control module 150 may be configured to stand alone or be integrated with and couple with other tools of the lithography system 100, such as the exposure module 110.

The lithography system 100 may includes other components to be coupled with other tools or components to perform various lithography processes. The lithography system 100 also includes computing hardware such as one or more conventional, commercially-available general purpose or specific purpose computers, a processor and a memory and/or one or more user interfaces, and hardware operable to perform actions including manipulating information, receiving information, storing information, and transferring information.

Figure 3:
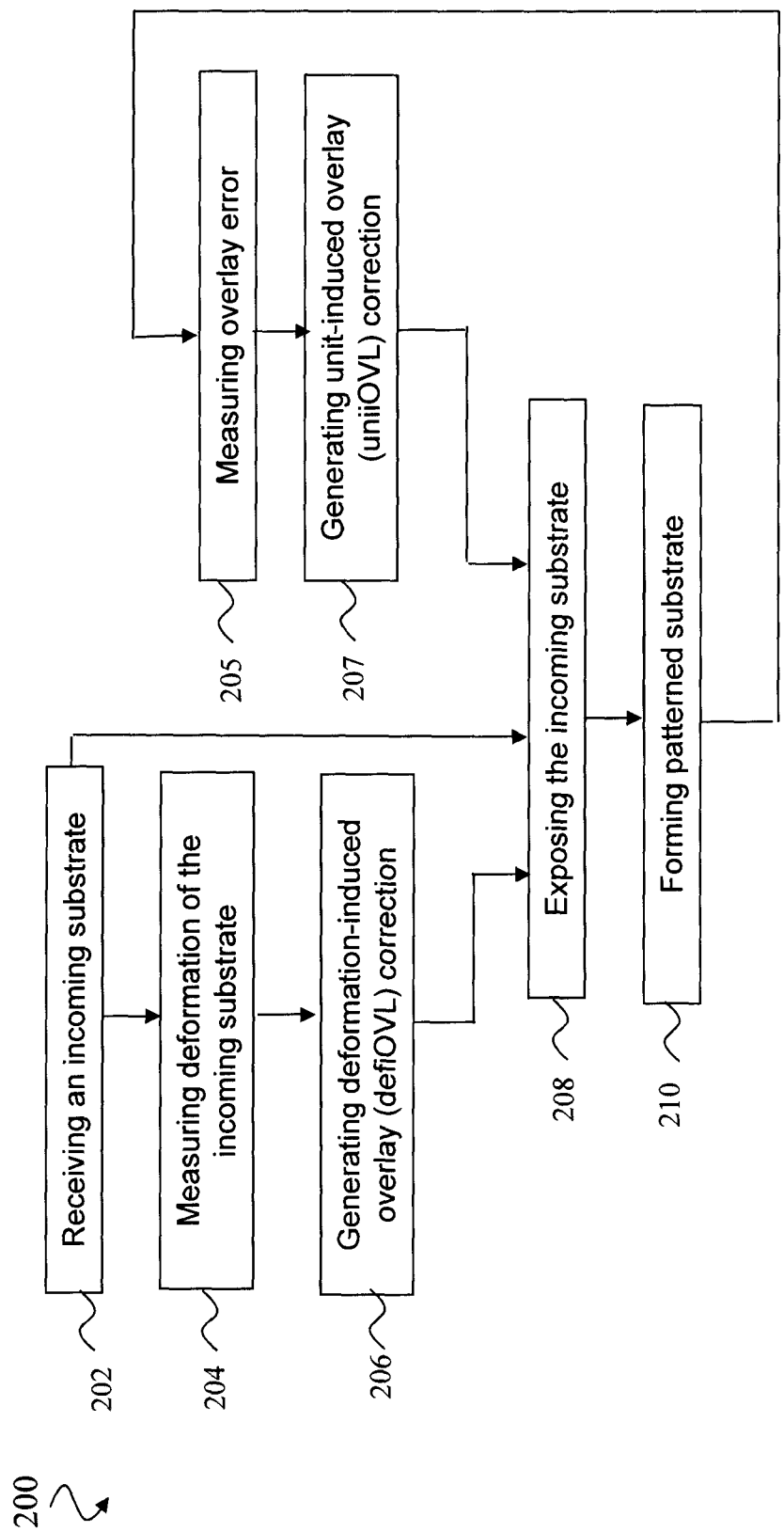
FIG. 3 is a flowchart of a lithography process according to various aspects of the present disclosure.

FIG. 3 is a flowchart of a lithography process 200 performed by the lithography system 100 of FIG. 1 according to various embodiments. The lithography process 200 in FIG. 3 is an overview and details associated with each step in the process will be described in association with the subsequent figures in the present disclosure.

The lithography process 200 begins at step 202 by receiving the incoming substrate. In one embodiment, the incoming substrate is an integrated circuit substrate (IC substrate), such as a semiconductor wafer (or wafer), having an elementary semiconductor such as crystal silicon, polycrystalline silicon, amorphous silicon, germanium, and diamond, a compound semiconductor such as silicon carbide and gallium arsenic, an alloy semiconductor such as SiGe, GaAsP, AlInAs, AlGaAs, and GaInP, or a combination thereof. The incoming substrate may include various regions, features for various microelectronic components, such as a complementary metal-oxide-semiconductor field-effect transistor (CMOSFET), an imaging sensor, a memory cell, and/or a capacitive element. The incoming substrate may include one or more layers, such as dielectric layers and conductive layers, formed thereon.

The lithography process 200 proceeds to step 204 by performing a deformation measurement on the incoming substrate by the deformation measurement tool 144. The incoming substrate may have gone through previous processes, such as film deposition, anneal, chemical mechanical polishing (CMP) and lithography processes. A deformation of the incoming substrate is often observed (e.g. bow, curvature, or waviness). For example, when the incoming substrate has had a stack of films deposited on it, such as silicon oxide, silicon nitride and metal layers, each film in the stack may contribute and accumulate a composite stress in the incoming substrate. And depending on each film's type, thickness, and receiving conditions during film formations, the composite stress of the incoming substrate may be compressive or tensile, which may lead the incoming substrate to have a convex shape, concave shape or other deformation. The deformation may be globally (e.g., the whole wafer) or locally (e.g., a portion of the wafer). For another example, due to different thermal expansion among each film layer formed in the incoming substrate, a total thermo-mechanical stress may be built up during an annealing process and it may cause the incoming substrate bow and warp. For yet another example, when a CMP process removes a top layer in the incoming substrate, a total built-up stress may change and results in a change in deformation situation as well. The deformation may cause an overlay error when such incoming substrate receives a lithography patterning process. Due to each incoming substrate may experience a different process condition to each other in previous processes, this deformation-induced overlay (defiOVL) error has a real-time nature and is hard to predict.

Figure 4:
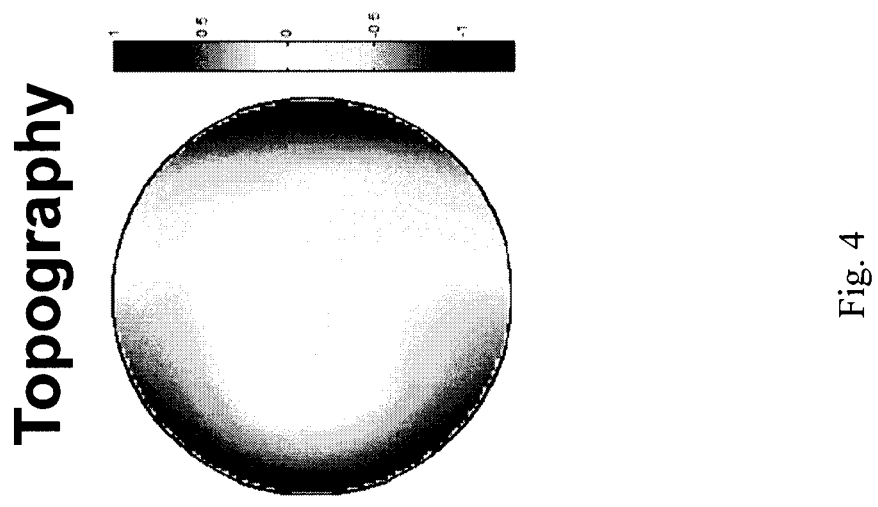
FIG. 4 is an exemplary embodiment of a deformation map used and/or generated by the lithography process of FIG. 3.

In the present embodiment, the incoming substrate is submitted to the deformation measurement tool 144 to obtain a precise quantitative measurement of topography variations, referred to as a deformation data. The deformation measurement tool 144 includes scanning interferometer, optical scanning deflectometer, atomic force microscopy and other proper tools. In one embodiment, the incoming substrate is measured by process control and yield management tool provided by KLA-Tencor Corp. and a two dimension topography map of the deformation data is generated, as shown in FIG. 4. In another embodiment, a deformation data of the incoming substrate is revealed as a three-dimension topography map by using a computer control and process monitoring tool provided by Zygo Gradient Corp.

The lithography process 200 proceeds to step 206 by generating a defiOVL correction from the deformation data. The defiOVL correction is generated by employing a predetermined algorithm or algorithms. The predetermined algorithm may include an empirical formula from previous data of an overlay error corresponding to deformation measurement. In one embodiment, the empirical formula is:

$$defiOVL = TG \times K$$

where TG is a topography gradient and K is a constant, which may be determined by process conditions, such as current lithograph step, previous process step and existing film type. In the present embodiment, the defiOVL correction is obtained from the incoming substrate and thus it contains a real-time characteristic. Then the defiOVL correction is fed to the exposure module 110 before performing exposing on the incoming substrate to achieve a real-time defiOVL control, which will be described in detail later.

Figure 5:
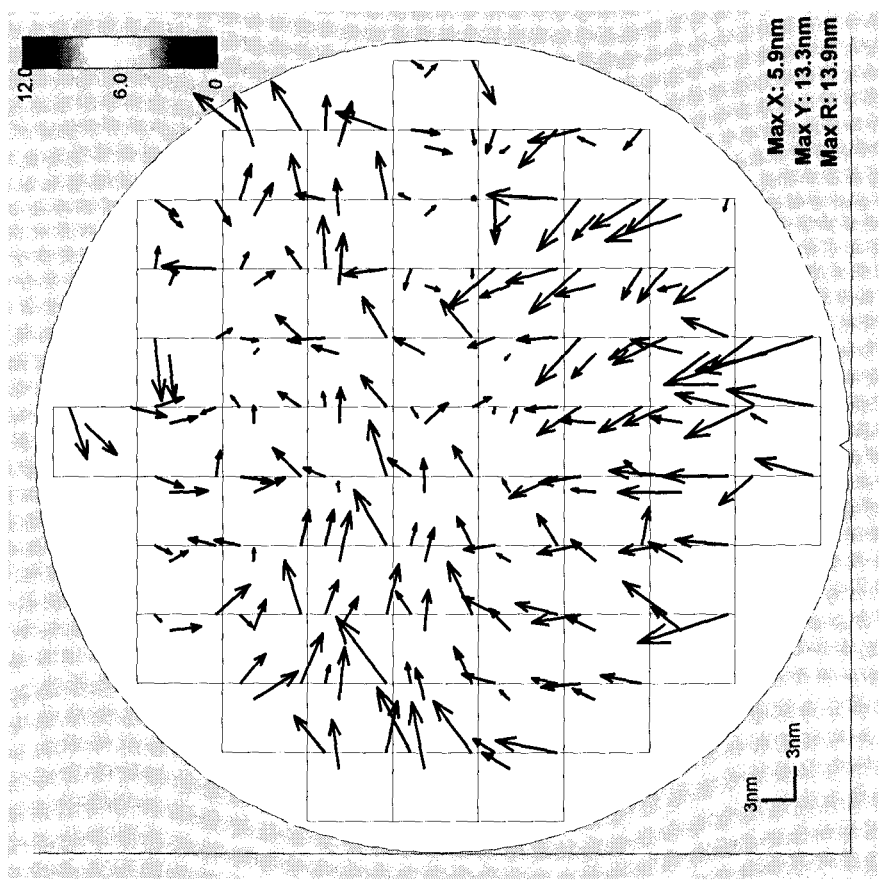
FIG. 5 is an exemplary embodiment of an overlay error map used and/or generated by the lithography process of FIG. 3.

Coincident with steps 204 and 206, the lithography process 200 proceeds to step 205 by performing an overlay measurement on a patterned substrate. The patterned substrate is a previous incoming substrate after receiving a patterning process, which will be described in detail later. The overlay measurement may be performed by the overlay tool 142 in FIG. 1. The overlay tool 142 may include an image-based overlay metrology system or a diffraction-based overlay metrology system. For example, the overlay tool 142 is equipped with a camera operable to scan and generate an overlay image. The overlay image may be digitized image of an overlay mark, provided on patterned substrate. The overlay mark may be constructed in different configurations, such as box-in-box, frame-in-frame and cross-in-box. The overlay image may then be digitized images and processes using various image analysis algorithms to determine an overlay error, e.g. an overlay error map. As an example, a virtual overlay error map is generated from overlay error as shown in FIG. 5. The virtual overlay error map may be constructed by comparing, on a point-by-point basis, the overlay measurements generated by the overlay image. The overlay error may raise from a mismatching/or misalignment between process units, such as between an exposure tool of current process and the one of a previous process, between mask and the substrate, and/or process variations. The overlay error is referred to as a unit-induced overlay (uniOVL) error.

Coincident with steps 204 and 206, the lithography process 200 proceeds to step 207 by generating a uniiOVL correction from the uniiOVL error. The uniiOVL is transferred to a database. The database manages several types of database, such as mask database, overlay offset database and the uniiOVL error. The mask database contains a representation of the mask features in a predetermined mask design standard such as GDSII, OASIS, or MEBES®, a registered trademark of Applied Materials. The overlay offset database includes offsets that were intentionally designed for and included in the mask. In the database an overlay correction is determined by applying a predetermined algorithm on databases in the database, such as mask database, overlay offset database and the uniiOVL error. The overlay correction is referred to as a uniiOVL correction. The uniiOVL correction is fed to the exposure module 110 before performing exposing on the incoming substrate, which will be described in detail below.

The lithography process 200 proceeds to step 208 by patterning the incoming substrate to form the patterned substrate. The incoming substrate is coated with a resist layer. For example, the resist layer is coated by the track module 120 in FIG. 1. Before applying exposure, the exposure process parameters may be adjusted with corresponding to the defiOVL correction and the uniiOVL correction. Then the incoming substrate with coated resist layer receives the radiation energy from the exposure module 110 with adjusted exposure parameters.

The lithography process 200 proceeds to step 210 by forming a patterned substrate. After receiving the exposure, a post-exposure-baking (PEB) and developing processes are performed on the incoming substrate to form a patterned substrate. The patterned substrate is sent to do another overlay measurement, which is similar in many respects to those discussed above in step 205. The overlay error measurement results of the patterned substrate will be used to generate a new uniiOVL correction in next run of exposure process.

Additional steps can be provided before, during, and after the lithography process 200, and some of the steps described can be replaced or eliminated for other embodiments of the method. Additionally, some steps may be performed concurrently with other steps.

Based on the above, it can be seen that the present disclosure offers a process for run-to-run (R2R) overlay control. The process provides not only a unit-induced overlay error control but also a real-time deformation-induced overlay error control.

The present disclosure provides many different embodiments of a lithography process that provide one or more improvements over the prior art. In one embodiment, the lithography process includes providing a lithography system. The lithography system includes an exposure module and an overlay module. The lithography process also includes receiving an incoming substrate, performing a deformation measurement on the incoming substrate by the overlay module, generating a deformation-induced overlay (defiOVL) correction from the deformation measurement results, then feeding forward the defiOVL correction to the exposure module and performing exposure process to the incoming substrate by the exposure module with the defiOVL correction.

In another embodiment, a lithography process includes providing a lithography system. The lithography system includes an exposure module, a track module and an overlay module. The lithography process also includes receiving an incoming substrate and an overlay offset, performing a deformation measurement on the incoming substrate in the overlay module, generating a deformation-induced overlay (defiOVL) correction from the deformation measurement results, feeding forward the defiOVL correction to the exposure module. Coincident with generating the defiOVL correction, the lithography process also includes generating a unit-induced overlay (uniiOVL) correction from the overlay offset, then feeding forward the uniiOVL correction to the exposure module and performing exposure process to the incoming substrate by the exposure module with the defiOVL correction and the uniiOVL correction together.

In yet another embodiment, a lithography process includes providing a lithography system. The lithography system includes an exposure module, a track module and an overlay module. The lithography process also includes receiving an incoming semiconductor wafer having a various features and layers formed on it and a unit-induced overlay (uniiOVL) correction, performing a deformation measurement on the incoming semiconductor wafer in the overlay module, generating a deformation-induced overlay (defiOVL) correction from the deformation measurement results by employing a predetermined algorithm on the deformation measurement results, then feeding forward the defiOVL correction to the exposure module and exposing the incoming semiconductor wafer by the exposure module with the defiOVL correction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography process, comprising:
   providing a lithography system that includes an exposure module and an overlay module;
   receiving a first incoming substrate into the lithography system;
   performing a deformation measurement on the first incoming substrate by the overlay module, the deformation measurement including measuring topography variations of the first incoming substrate;
   generating a deformation-induced overlay (defiOVL) correction from the deformation measurement;
   feeding forward the defiOVL correction to the exposure module; and
   performing an exposure process to the first incoming substrate by the exposure module using the defiOVL correction.

2. The process of claim 1, wherein the first incoming substrate is a semiconductor wafer.

3. The process of claim 2, wherein the semiconductor wafer includes multiple layers formed thereon.

4. The process of claim 2, wherein the semiconductor wafer includes multiple features formed thereon.

5. The process of claim 1, wherein the defiOVL correction is generated by employing a predetermined algorithm on the deformation measurement.

6. The process of claim 5, wherein the predetermined algorithm includes an empirical formula of defiOVL=TG×K, where TG is a topography gradient and K is a constant, and
   wherein the empirical formula is determined using previous data of an overlay error corresponding to previous deformation measurement.

7. The process of claim 1, after performing the deformation measurement, further comprising:
   coating the first incoming substrate with a resist layer.

8. The process of claim 7, after performing an exposure process to the first incoming substrate, further comprising:
   forming a first patterned resist layer on the first incoming substrate;
   performing an overlay measurement on the first patterned resist layer;
   generating a unit-induced overlay (uniiOVL) correction from the overlay measurement and an overlay offset; and
   feeding forward the uniiOVL correction to the exposure module.

9. The process of claim 8, wherein the uniiOVL correction is generated by employing a predetermined algorithm on the overlay measurement and the overlay offset.

10. The process of claim 8, further comprising:
    exposing a second incoming substrate by the exposure module using a defiOVL correction of the second incoming substrate and the uniiOVL correction of the first patterned resist layer to form a second patterned substrate.

11. The process of claim 10, wherein the second patterned substrate is sent to the overlay module for a new overlay measurement.

12. A lithography process for use in a lithography system including an exposure module, a track module, and an overlay module, the process comprising:
    receiving an incoming substrate;
    receiving an overlay measurement data from a first patterned substrate;
    performing a deformation measurement on the incoming substrate with the overlay module;
    generating a deformation-induced overlay (defiOVL) correction from the deformation measurement;
    feeding forward the defiOVL correction to the exposure module;
    coincident with generating the defiOVL correction, generating a unit-induced overlay (uniiOVL) correction from the overlay measurement data on the first patterned substrate;
    feeding forward the uniiOVL correction to the exposure module; and
    performing an exposure process to the incoming substrate by the exposure module using the defiOVL correction and the uniiOVL correction.

13. The process of claim 12, wherein the incoming substrate includes a semiconductor wafer having a plurality features formed thereon.

14. The process of claim 12, wherein the defiOVL correction is generated by a predetermined algorithm on the deformation measurement.

15. The process of claim 14, wherein the predetermined algorithm includes an empirical formula of DefiOVL=TG×K, where TG is a topography gradient and K is a constant.

16. The process of claim 12, wherein the uniiOVL correction is generated by employing a predetermined algorithm on an overlay offset and the overlay measurement data.

17. The process of claim 12, further comprising:
    after performing the deformation measurement, coating the incoming substrate with a resist layer in the track module, wherein the exposure process is performed on the resist layer to form a second patterned substrate; and
    sending the second patterned substrate to the overlay module to perform an overlay measurement.

18. A lithography process, comprising:
    receiving an incoming semiconductor wafer having various features and layers formed thereon;
    receiving a unit-induced overlay (uniiOVL) correction;
    performing a deformation measurement on the incoming semiconductor wafer in an overlay module;
    generating a deformation-induced overlay (defiOVL) correction from the deformation measurement by employing a predetermined algorithm on the deformation measurement results;
    feeding forward the defiOVL correction to an exposure module; and
    performing an exposure process to the incoming semiconductor wafer by the exposure module with the defiOVL correction,
    wherein the predetermined algorithm includes an empirical formula which is determined from previous data of an overlay error corresponding to previous deformation measurement.

19. The process of claim 18, wherein after the deformation measurement, the incoming semiconductor wafer is coated with a resist layer for the exposing process.

20. The process of claim 18, further comprising:
- coincident with feeding forward the defiOVL correction, feeding the uniiOVL correction to the exposure module; and
- exposing the incoming semiconductor wafer by the exposure module using the defiOVL correction and the uniiOVL correction.

* * * * *